United States Patent [19]
Yamada

[11] Patent Number: 5,827,778
[45] Date of Patent: Oct. 27, 1998

[54] METHOD OF MANUFACTURING A SEMICONDUCTOR DEVICE USING A SILICON FLUORIDE OXIDE FILM

[75] Inventor: Yoshiaki Yamada, Tokyo, Japan

[73] Assignee: NEC Corporation, Tokyo, Japan

[21] Appl. No.: 753,095

[22] Filed: Nov. 20, 1996

[30] Foreign Application Priority Data

Nov. 28, 1995 [JP] Japan ..................................... 7-309108

[51] Int. Cl.⁶ ........................ H01L 21/283; H01L 21/285
[52] U.S. Cl. ......................... 438/637; 438/700; 438/788; 438/783; 438/784; 438/787
[58] Field of Search ..................... 438/624, 626, 438/675, 700, 723, 787, 788, 783, 784, 637

[56] References Cited

U.S. PATENT DOCUMENTS

| 5,334,552 | 8/1994 | Homma . |
| 5,489,553 | 2/1996 | Chen . |
| 5,661,093 | 8/1997 | Ravi et al. . |

FOREIGN PATENT DOCUMENTS

| 2-87621 | 3/1990 | Japan . |
| 08-124910 | 5/1996 | Japan . |
| 08-213386 | 8/1996 | Japan . |

OTHER PUBLICATIONS

Minako Murakami, et al. "SiOF Films: the Problem in Logic Devices" Semiconductor International pp. 291–292, Jul. 1996.

Japan Abstract of Application Physics and Related Societies Extended Abstracts, 194, Autumn Meeting, Manuscript No. 20P–ZD–13, p. 672 No month.

*Primary Examiner*—Caridad Everhart
*Attorney, Agent, or Firm*—Sughrue, Mion, Zinn, Macpeak & Seas, PLLC

[57] ABSTRACT

A method of manufacturing a semiconductor device comprises the steps of forming a first layer interconnect pattern overlying a substrate, forming consecutively a thin silicon oxide film and a thick silicon fluoride oxide film, selectively etching the silicon fluoride oxide film to expose a part of the silicon oxide film by using a first gas of a low fluorine content, and etching the exposed silicon oxide film by using a second gas of a high fluorine content to form a via-hole reaching the first layer interconnect pattern The silicon oxide film has a thickness from 50 to 200 nm while the silicon fluoride oxide film has a thickness of 1 μm or higher. The thin silicon oxide film provides a reduced amount of an over-etch while thick silicon fluoride oxide film provides a low capacitance for the interconnect to achieve a higher operation of the LSI.

17 Claims, 8 Drawing Sheets

METHOD OF MANUFACTURING A SEMICONDUCTOR DEVICE USING A SILICON FLUORIDE OXIDE FILM

BACKGROUND OF THE INVENTION (a) Field of the Invention

The invention relates to a method for manufacturing a semiconductor device having a multi-layer interconnection structure, and in particular, to a method of manufacturing a semiconductor device having a silicon fluoride oxide film defining part of an interlayer insulating layer.

(b) Description of the Related Art

It has been the practice to achieve a higher level of integration and performance of semiconductor devices by use of a fine patterning and a multi-layer interconnection structure. A smaller design for the multi-layer interconnection reduces not only the width of the interconnect and the spacing between interconnects or via-holes disposed between the interconnect layers, but also an alignment margin between the interconnect pattern and via-holes. For an interconnection pitch equal to or less than 0.6 $\mu$m, it is necessary to use substantially comparable sizes for the width of the interconnect pattern and the size of the via-holes.

However, the accuracy of alignment achieved by an exposure unit cannot catch up with a reduction in the margin, and accordingly the via-hole may protrude beyond a side of the interconnect. Such an instance for the formation of a via-hole will be described with reference to the drawings.

FIGS. 1A to 1E are cross-sections illustrating consecutive steps of a first conventional example of manufacturing a semiconductor device. Referring first to FIG. 1A, a first layer interconnect pattern 53 made of polycrystalline silicon is formed on a surface insulator film 52 made of silicon oxide covering a silicon substrate 51. An interlayer insulating film 54 made of BPSG (Boron Phosphorous Silica Glass) is then formed, followed by flattening by a chemical-mechanical polishing process (CMP process).

A photoresist film 55 is then formed on the surface of the interlayer insulating film 54, as shown in FIG. 1B, and a pattern for a via-hole is formed therein. When the alignment during the exposure of the photoresist film is imperfect, the resulting via-hole slightly protrudes beyond a side of the first layer interconnect pattern 53.

The interlayer insulating film 54 is then etched by a dry etching technique using a mixture gas of $CHF_3$ and $O_2$, using the photoresist film 55 as a mask, as shown in FIG. 1C. Assuming that the thickness of the interlayer insulating film 54 on the first layer interconnect pattern 53 is on the order of 0.6 $\mu$m and the thickness of the first layer interconnect pattern 53 is equal to 0.3 $\mu$m, the etching of the interlayer insulating film 54 normally uses an over-etch on the order of 100% to thereby etch a normal oxide film having a thickness of 1.2 $\mu$m. Eventually, the silicon oxide film 52 located on lateral side of the first layer interconnect pattern 53 will be etched, thereby exposing the silicon substrate 51, as shown in FIG. 1C.

Subsequently, $WF_6$ gas is introduced and reduced by $SiH_4$ to selectively grow a metal tungsten (W) plug 57 on the silicon surface, thereby filling the via-hole 56, as shown in FIG. 1D. A second layer interconnect pattern 58 is then formed by using Al alloy, as shown in FIG. 1E. It will be noted that the second layer interconnect pattern 58 will be connected to the silicon substrate 51 through the tungsten plug 57 at a location where they must not be connected together.

This problem could be overcome by a second conventional example which uses a reduced time interval for the over-etching to form the via-hole. However, when it is desired to simultaneously form via-holes on different interconnects located at different levels as illustrated in FIG. 2A, the etching step will take place in accordance with the condition for the deepest via-hole 67. This results in an excessive over-etch with respect to the shallower via-hole 68 The etching will reach the underlying, first layer interconnect pattern 63, which must not be connected by the via-hole.

To overcome the problem presented by the second conventional example, it is contemplated to employ a laminated structure comprising insulator films which exhibit different etching rates so that the over-etch for the via-hole could be stopped by one of the insulator films which exhibits a lower etching rate and which is disposed as the lower layer, thereby preventing adverse influences of the over-etch from occurring in the underlying layer. An example relating to this technique is disclosed in Patent Publication No. JP-A-1990-87,621 which will be referred to as a third conventional example. This technique will be specifically described with reference to FIGS. 3A to 3E.

Initially, a first layer interconnect pattern 74 made of polycrystalline silicon is formed on a silicon oxide film 73 covering a silicon substrate 71 in which a diffused region 72 is formed. Subsequently, a first interlayer insulating film 75 made of silicon oxide is formed, as shown in FIG. 3A, followed by forming a second interlayer insulating film 76 made of BPSG, as shown in FIG. 3B. The thickness of the silicon oxide film, which defines the first interlayer insulating film 75, is selected on the order of 150 nm while the BPSG film, which defines the second interlayer insulating film 76 is equal to or greater than 1 $\mu$m. After a heat treatment which takes place within a nitrogen atmosphere at a temperature on the order of 850° C., the surface is flattened by a CMP process.

A photoresist film 77 is then formed on the second interlayer insulating film 76, and a via-hole pattern is formed by a photolithographic etching technique, as shown in FIG. 3C. When the alignment during the exposure is imperfect, the via-hole pattern will protrude beyond a side of the first layer interconnect pattern 74 by, for example, an amount of 100 nm.

Subsequently, by using the photoresist film 77 as a mask, the second interlayer insulating film 76 is etched. A time interval for the etching operation is determined as required to etch the deepest via-hole 78a through the second interlayer insulating film 76, by suitably selecting an etching condition so that the first interlayer insulating film 75 is scarcely etched. In the via-hole 78b which reaches shallower interconnect 74, an increased amount of over-etch will occur, and the etching is stopped by the first interlayer insulating film 75 to prevent etching from proceeding to the lateral side of the first interconnect 74, as shown in FIG. 3D.

Subsequently, the etching condition is changed so as to permit the silicon oxide film 75 to be etched, thereby etching the first interlayer insulating film 75. The thickness of the first interlayer insulating film 75 is constant at the bottoms of the respective via-holes 78a 78b, and is thin enough to be on the order of 150 nm. Accordingly, an increased amount of over-etch is not required to avoid an etching of the first interlayer insulating film 75 located at lateral side of the first interconnect 74. Subsequently, the photoresist film 77 is removed, and metal tungsten is selectively grown by a CVD process to fill the via-holes 78a, 78b, followed by forming an aluminum interconnect pattern 79 by using Al alloy, as shown in FIG. 3E.

In the conventional examples as described above, silicon oxide film or BPSG film is used to define an interlayer insulating layer. On the other hand, recently, use of a silicon fluoride oxide film, which is obtained by adding fluorine to a silicon oxide film, is proposed as an interlayer insulating layer.

As the level of integration of LSI proceeds, the pitch of interconnect pattern and the spacing between the interconnects are reduced, which causes an increase in the parasitic capacitance between adjacent interconnects. The parasitic capacitance gives rise to a problem that it retards the operational speed of an LSI. Attention is directed to the use of silicon fluoride oxide film, which exhibits a reduced dielectric constant as compared with the silicon oxide film, in order to reduce the magnitude of such parasitic capacitance.

When a silicon fluoride oxide film is used which directly contacts a metal, the presence of fluorine within the silicon fluoride oxide film may degrade adherence properties, causing a peel-off (See the Japan Association of Applied Physics and Related Societies, Extended Abstracts, 1994, Autumn meeting, Manuscript p-672, 20P-ZD-13). As a remedy to this program, it is contemplated to provide a silicon oxide film between the interconnection metal and a silicon fluoride oxide film. An example of laminating a silicon oxide film and a silicon fluoride oxide film to define an interlayer insulating film (hereafter referred to as a fourth conventional example) will be described with reference to the drawings.

FIGS. 4A to 4D are cross-sections, illustrating consecutive steps of the fourth conventional example. In FIG. 4A, a first layer interconnect pattern 83 made of Al alloy is formed on a silicon oxide film 82 covering a silicon substrate 81. Subsequently, a silicon oxide film is formed to define a first interlayer insulating film 84, a silicon fluoride oxide film is then formed to define a second interlayer insulating film 85, and a silicon oxide film is formed to define a third interlayer insulating film 86.

The silicon oxide films 84 and 86 are both thin on the order of 50 to 200 nm. By contrast, the silicon fluoride oxide film which defines the second interlayer insulating film 85 is formed to a greater thickness, and then the surface is flattened by a CMP process. The thickness of the first layer interconnect pattern 83 comprising Al alloy is on the order of 0.5 to 1.0 µm. Subsequently, a photoresist film 87 is formed on the third interlayer insulating film 86, as shown in FIG. 4B, and patterning for forming via-holes is conducted. It will be noted that the via-hole pattern protrudes beyond a side of the first layer interconnect pattern 83.

By using the photoresist film 87 as a mask, the third interlayer insulating film 86, second interlayer insulating film 85, and first interlayer insulating film 84 are sequentially etched to form a via-hole 90 by a conventional dry etching technique, for example, by using a combination of $CHF_3$ and $O_2$ gas, as illustrated in FIG. 4C. At this time, an over-etch on the order of 100% takes place with respect to the combined thickness of the three layers, resulting in an etching at the lateral side of the first layer interconnect pattern 83 made of Al alloy.

Subsequently, the photoresist film 87 is removed, and metal tungsten (W) film 88 is selectively grown to fill the via-hole 90 by using a CVD process, followed by forming a second layer interconnect pattern 89 by using Al alloy.

The fourth conventional example as described above also present a problem in that the conventional dry etching technique, when applied to etching a via-hole, cannot etch only the silicon fluoride oxide film without an etching of the silicon oxide film. Accordingly, in the event that the via-hole protrudes beyond a side of the interconnect pattern, the silicon oxide film located at the side of the interconnect will be etched, causing a short-circuit with an underlying interconnect pattern and degrading the reliability of the interconnects.

SUMMARY OF THE INVENTION

Accordingly, it is and object of the present invention to provide a method of manufacturing a semiconductor device having a silicon fluoride oxide film exhibiting a reduced dielectric constant as an interlayer insulating film, in order to prevent a reduction in the operational speed of the semiconductor device without causing degradation as mentioned above.

In accordance with the present invention, there is provided a method for forming a semiconductor device including the steps of forming an insulator film overlying a semiconductor substrate, forming a first layer interconnect pattern on the insulator film, forming a first interlayer insulating film containing silicon oxide on the first layer interconnect pattern, forming a second interlayer insulating film containing silicon fluoride oxide on the first interlayer insulating film, selectively etching the second interlayer insulating film to expose a part of the first interlayer insulating film by using a first gas containing fluorine in a first concentration, selectively etching the exposed part of the first interlayer insulating film to form a via-hole exposing the first layer interconnect pattern by using a second gas containing fluorine in a second concentration which is higher than the first concentration.

It is preferred that the first interlayer insulating film has a thickness from 50 to 200 nm in the semiconductor device according to the present invention.

It will be noted that in the method of manufacturing a semiconductor device according to the invention, the silicon oxide film has a small thickness, and hence the amount of over-etch can be reduced. Accordingly, even if a via-hole protrudes beyond a side of the underlying first layer interconnect pattern, the lateral side at the interconnect pattern is little etched. In this manner, there is provided a semiconductor device in which an etching at the lateral side of an interconnect is avoided even if a via-hole protrudes beyond a side of the interconnect, thus avoiding a short-circuit with an underlying interconnect or diffused layer or a degradation in the reliability.

It will also be noted that in accordance with the invention, the etching of the silicon fluoride oxide film takes place under a condition which ensures that an underlying silicon oxide film is little etched, and then the thin silicon oxide film is etched to form a via-hole. In this manner, the amount of an over-etch will be same for a via-hole which have different depths. Accordingly, there is provided a semiconductor device in which the via-hole can be formed with an excellent yield without degrading the reliability.

Further, in accordance with the invention, the interconnect can be covered by the silicon oxide film which is disposed in surrounding relationship therewith even after the via-hole is formed. In this manner, there is provided a semiconductor device in which a close adherence between the interconnect and the interlayer insulating film is assured, preventing a peel-off from occurring.

Several embodiments of the invention will now be specifically described with reference to the drawings.

DESCRIPTION OF THE PREFERRED EMBODIMENTS

Figure 5A:
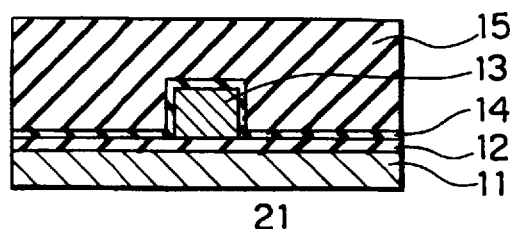
FIGS. 5A to 5F are cross-sections of a semiconductor device, illustrating consecutive steps of a manufacturing process according to a first embodiment of the invention.

Referring to FIGS. 5A to 5F, there is shown a manufacturing process for a semiconductor device according to a first embodiment of the invention. In FIG. 5A, a silicon substrate 11 includes unillustrated diffused regions formed therein, and its surface is covered by a silicon oxide film 12. A first layer interconnect pattern 13 made of an aluminum alloy is formed on the silicon oxide film 12. A first interlayer insulating film 14 made of silicon oxide is formed to a thickness from 50 to 200 nm (nanometers) by using a plasma CVD process, followed by forming a second interlayer insulating film 15 made of silicon fluoride oxide to a thickness from 1.0 to 2.0 μm by using a plasma CVD process. Subsequently, the surface of the second interlayer insulating film 15 is flattened by a CMP process by an amount on the order of 0.5 to 1.0 μm. The fluorine concentration in the silicon fluoride oxide film 15, which defines the second interlayer insulating film, should be on the order of from 5 to 15%, and in this embodiment, the concentration is equal to 10%.

A photoresist film 16 is then formed on the second interlayer insulator film 15, and a via-hole pattern is formed therein for the first layer interconnect pattern 13 by an exposure process using an projection aligner. As a result of an error in alignment during the exposure, a resulting via-hole pattern may protrude beyond a side of one of the first layer interconnects 13 by an amount of 50 to 100 nm.

Figure 5B:
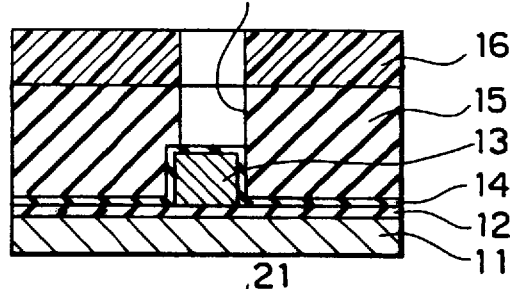

Subsequently, the second interlayer insulator film is etched by using the photoresist film 16 as a mask, as shown in FIG. 5B. This etching step takes place by using a mixture gas of $CHF_3$ and CO, and the flow rate of CO is selected to be equal to or greater than 90% of the total gas flow rate of $CHF_3$ and CO. In this example, CO flow rate is selected to be equal to 95%. The etching operation is executed under a pressure from 30 to 60 mTorr and an electric power from 500 to 600 W. Under such condition, the etching rate of the silicon oxide film is small while the silicon fluoride oxide film is effectively etched. Accordingly, if an over-etch on the order of 100% takes place in the silicon fluoride oxide film 15, the first interlayer insulating film 14 made of silicon oxide is little etched. The fluorine concentration in the silicon fluoride oxide film 15 is selected to be equal to or greater than 5% since it is difficult to provide an increased difference in the etching rate between the silicon fluoride oxide film 15 and the silicon oxide film 14 if the fluorine concentration is low in the silicon fluoride oxide film 15.

On the other hand, if the fluorine concentration is too high in the silicon fluorine oxide film 15, an increased amount of water content finding its way into the film will result to react with the fluorine within the film to form hydrofluoric acid. The hydrofluoric acid may etch the silicon oxide film 14 or the silicon fluoride oxide film 15 or may cause a corrosion of Al alloy which defines the first interconnect pattern 13. Accordingly, the fluorine concentration in the silicon fluorine oxide film 15 should be less than 15%. A relationship which prevails between the etching rate and CO flow rate ratio for an etchant will be described below.

Figure 1A:
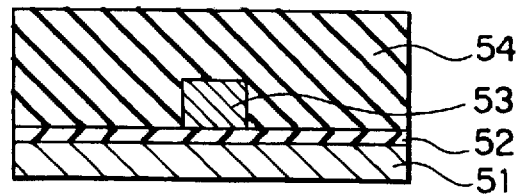
FIGS. 1A to 1E are cross-sections of a semiconductor device, illustrating consecutive steps of a manufacturing process for showing a first conventional example.
Figure 1B:
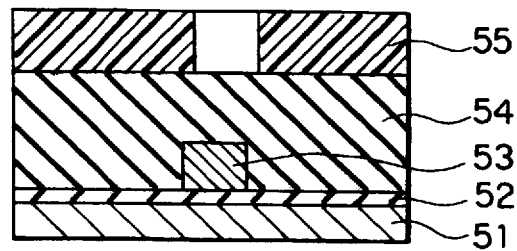
Figure 1C:
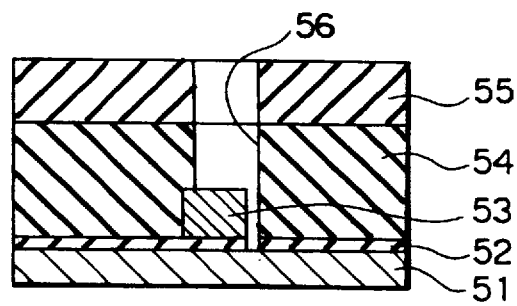
Figure 1D:
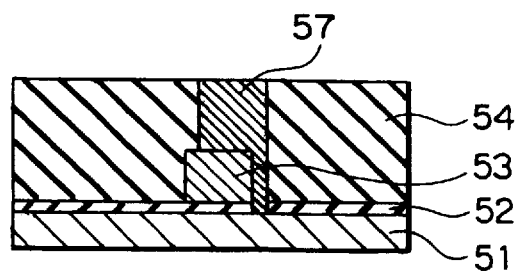
Figure 1E:
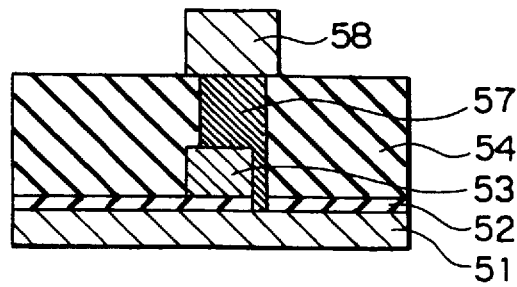
Figure 2A:
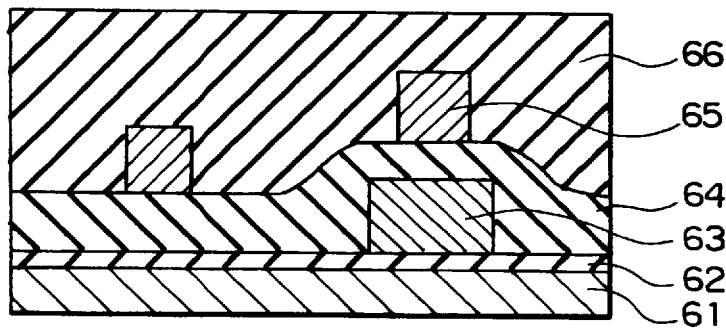
FIGS. 2A and 2B are cross-sections of a semiconductor device, illustrating consecutive steps of another manufacturing process for showing a second conventional example.
Figure 2B:
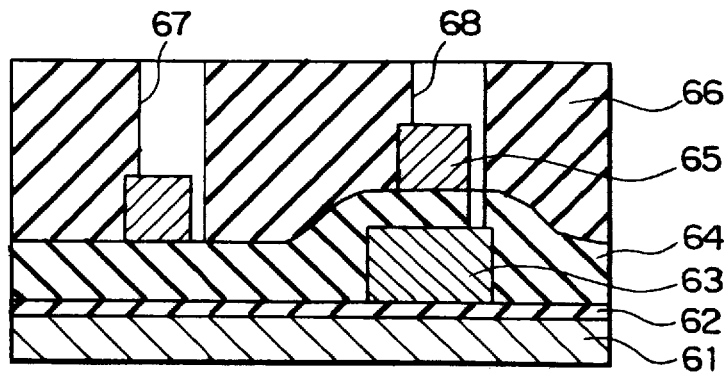
Figure 3A:
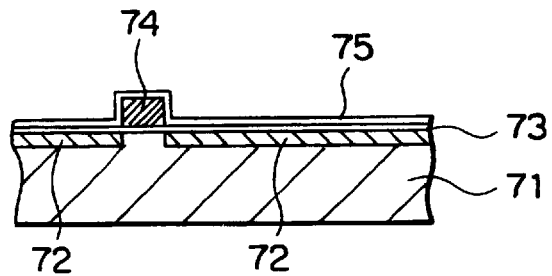
FIGS. 3A to 3E are cross-sections of a semiconductor device, illustrating consecutive steps of another manufacturing process for showing a third conventional example.
Figure 3B:
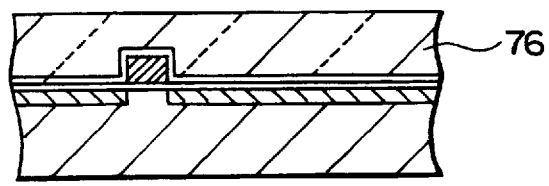
Figure 3C:
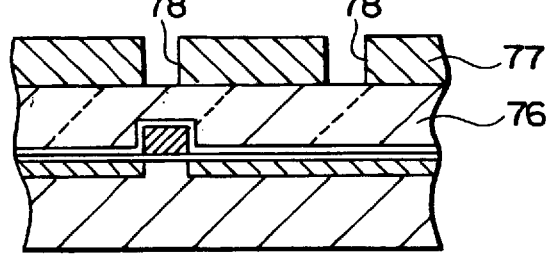
Figure 3D:
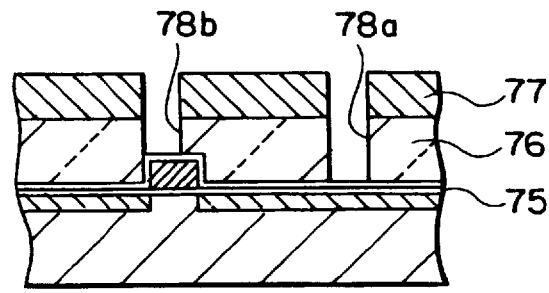
Figure 3E:
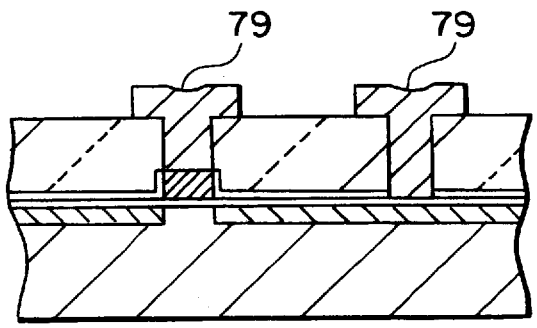
Figure 4A:
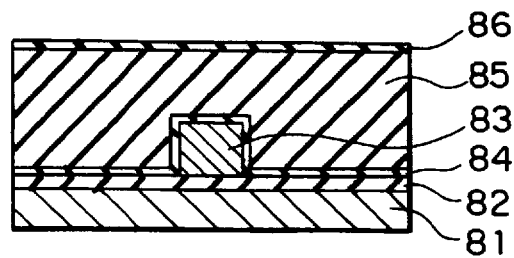
FIGS. 4A to 4D are cross-sections of a semiconductor device, illustrating consecutive steps of another manufacturing process for showing a fourth conventional example.
Figure 4B:
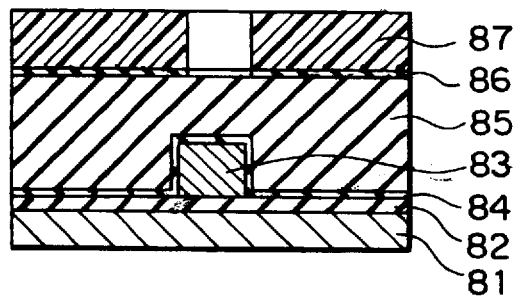
Figure 4C:
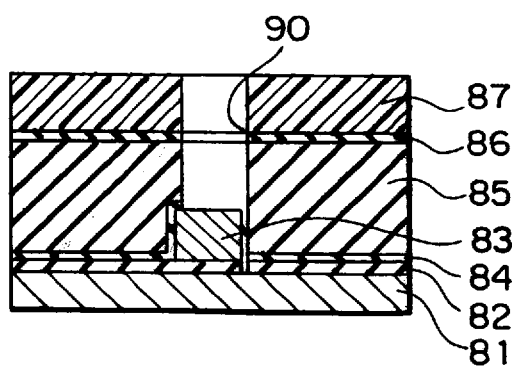
Figure 4D:
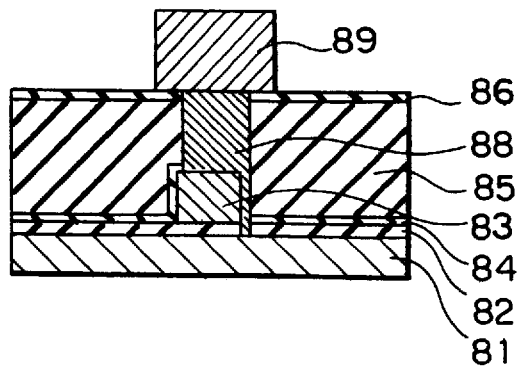

FIG. 2 graphically shows the relationship between the etching rates of the silicon oxide film and the silicon fluoride oxide film which contains 10% of fluorine and the ratio of flow rate of CO with respect to the total flow rate of $CHF_3$ and CO. As shown in FIG. 2, when the CO flow rate is less than 60%, the etching rates of both the silicon oxide film and the silicon fluoride oxide film are substantially similar, and decrease as the CO concentration increases. However, because a decrease in the etching rate of the silicon oxide film occurs more rapidly, the difference in the etching rate between the silicon oxide film and the silicon fluoride oxide film increases. At a CO flow rate equal to or greater than 90%, the etching rate of the silicon oxide film will be one half that of the silicon fluoride oxide film or less, and at 95%, it will be equal to or less than 10% that of the silicon fluoride oxide film.

Assuming that the thickness of the second interlayer insulating film 15 overlying the first layer interconnect pattern 13 is on the order of 0.5 μm, the silicon oxide film 14 will be etched on the order of 50 nm if an over-etch of 100% takes place in the silicon fluoride oxide film 15. Accordingly, if the silicon oxide film 14 has a thickness equal to or greater than 50 nm, an exposure of Al alloy which forms the first layer interconnect pattern 13 is avoided. That is, the silicon oxide film located on a lateral side of the first layer interconnect pattern 13 will not be etched if the silicon oxide film has a thickness not less than an amount by which a via-hole 11 protrudes beyond the side of the first layer interconnect pattern 13.

Figure 5C:
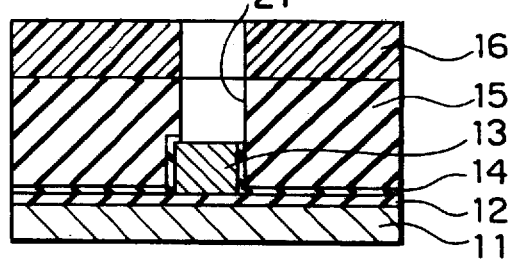
Figure 5D:
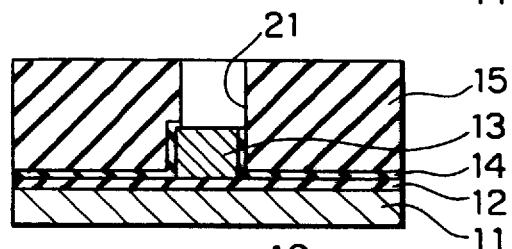

Referring to FIG. 5C, subsequent to the etching of the silicon fluoride oxide film 15, the silicon oxide film 14 on top of the first layer interconnect pattern 13 is etched under a condition of about 50% in the flow rate of CO gas relative to the total gas flow rate of $CHF_3$ and CO. Since the thickness of the silicon oxide film 14 is small, an over-etch can cause little etching of the lateral side on the first layer interconnect pattern 13.

If the thickness of the silicon oxide film 14 is excessively large, an increased amount of over-etch for the silicon oxide film 14 is required in order to remove the same on top of the first layer interconnect pattern 13, which causes the lateral side on the first layer interconnect pattern 13 to be etched. Accordingly, the thickness of the silicon oxide film should be equal to or less than 200 nm. A minimum thickness required for the silicon oxide film 14 is such that the silicon oxide film 14 remains after an over-etch of the silicon fluoride oxide film 15 takes place. That is, the thickness should be larger than a maximum amount of protrusion of the via-hole from a side of the interconnect pattern 13 caused by the alignment process, which may be 50 nm at a minimum in the exposure unit.

Subsequent to the etching of the silicon oxide film 14, the photoresist film 16 is removed, and alumina formed on the surface of the first layer interconnect pattern 13 located at the bottom of the via-hole 21 is removed by sputtering using Ar gas. Thereafter, titanium film 17 and a titanium nitride film 18 are consecutively formed by a sputtering process. The thicknesses of the titanium film 17 and the titanium nitride film 18 are on the order of 20 to 60 nm and 50 to 100 nm, respectively.

Figure 5E:
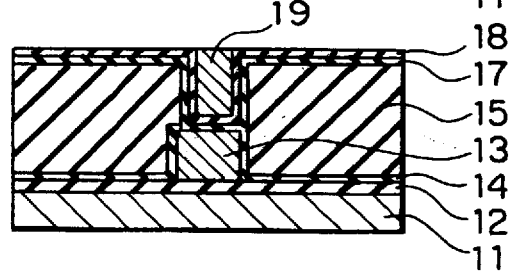

Subsequently, as shown in FIG. 5E, a tungsten film 19 is grown by a CVD process using $WF_6$ gas on the titanium nitride film 18 to a thickness which is sufficient to fill the via-hole 21. The tungsten film 19 is then etched until the titanium nitride film 18 is exposed, thereby leaving the tungsten plug 19 in the via-hole 21.

Figure 5F:
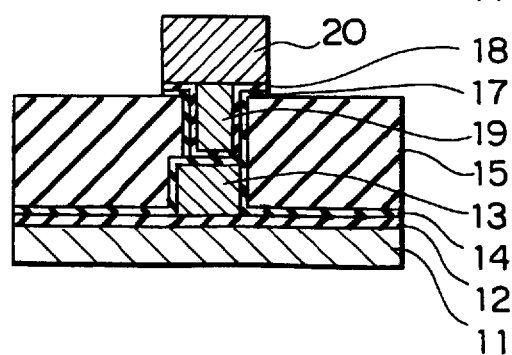

Thereafter, Al alloy film 20 is formed over the entire surface by a sputtering process, and the Al alloy film 20, titanium nitride film 18 and titanium film 17 are patterned by usual photolithographic and dry etching techniques, thereby forming a second layer interconnect pattern, as shown in FIG. 5F.

The principle of the method of manufacturing a semiconductor device according to the first embodiment of the invention will now be described. If the via-hole protrudes beyond a side of the first layer interconnect pattern 13 made of Al Alloy, and if the amount of the protrusion is less than the thickness of the silicon oxide film 14, as shown in FIG. 5B, an over-etch does not cause an etching of the lateral side on the first layer interconnect pattern 13, because the etching of the silicon fluoride oxide film 15 takes place under a condition of reduced fluorine content by conducting the etching step under the condition that CO is equal to or greater than 90% (See FIG. 2). That is, the etching is stopped by the first interlayer insulating film 14.

Subsequently, the silicon oxide film 14 is etched in the manner illustrated in FIG. 5C under the condition of a high concentration of fluorine. In this step, an etchant containing the two kinds of gases can be modified for obtaining different etching rates by modifying the concentration of the two gases. It will be appreciated that since the silicon oxide film 14, which defines the first interlayer insulator film, is thin, an increased amount of over-etch is not required, and accordingly, during this etching step, the lateral side on the first layer interconnect pattern 13 can be little etched. Hence, if the via-hole 21 slightly protrudes beyond a side of the first layer interconnect pattern 13, the via-hole 21 can be formed in a suitable configuration, preventing any short-circuit or reduction in the reliability of the via-hole 21.

In the first embodiment as described above, it will be noted that, of the interlayer insulating layer including the first and second interlayer insulating films 14 and 15, the first interlayer insulating film 14, made of the silicon oxide film, is extremely thin as compared to the second interlayer insulating film 15. Accordingly, it can be stated that the interlayer insulating layer is substantially formed by the silicon fluoride oxide film 15, and increase in the capacitance of the interconnect layers as compared with that occurring when the interlayer insulating layer is formed solely by the silicon fluoride oxide film will be very small.

Figure 7A:
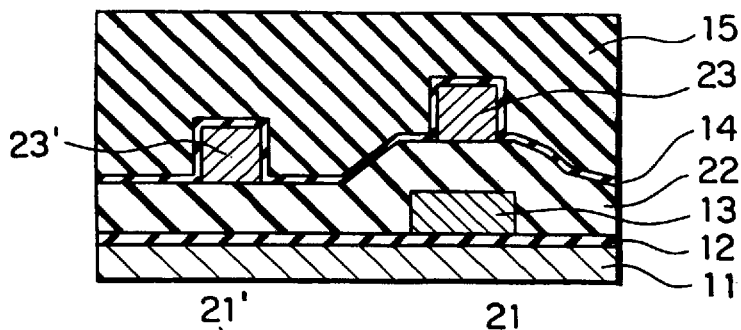
FIGS. 7A to 7D are cross-sections of a semiconductor device, illustrating consecutive steps of another manufacturing process according to a second embodiment of the invention.
Figure 7B:
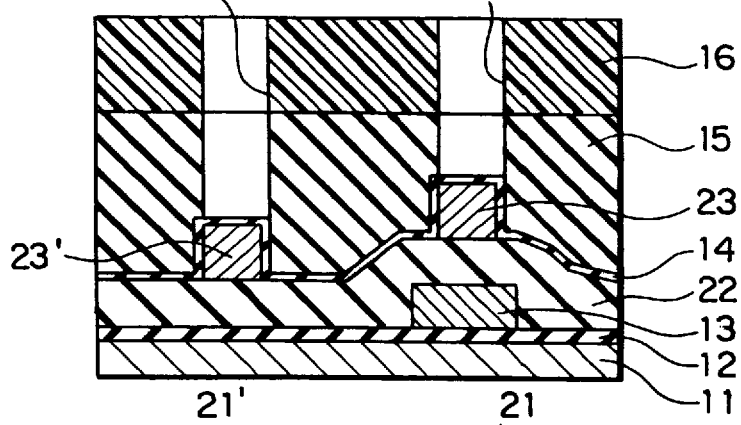

Next, a second embodiment of the invention will be described with reference to FIGS. 7A to 7D in which, as in other drawings, similar elements are designated by similar reference numerals as in FIGS. 5A to 5F. Referring first to FIG. 7A, a first layer interconnect pattern 13 made of a polycrystalline silicon is formed on a silicon oxide film 12 covering a silicon substrate 11. Then, a first interlayer insulating film 22 made of BPSG is formed. A second layer interconnect pattern 23 and 23' made of Al alloy is formed on the BPSG film 22.

It will be noted that the elevation of the second layer interconnect 23 in a region located above the first layer interconnect pattern 13 is different from the elevation of the second layer interconnect 23' in a region where the first layer interconnect pattern 13 does not exist, by an amount corresponding to the thickness of the first layer interconnect pattern 13. Subsequently, a first interlayer insulating film 14 made of silicon oxide is formed by a plasma CVD process to a small thickness on the order of 100 to 200 nm, followed by forming a second interlayer insulating film 15 made of silicon fluoride oxide to a thickness of 2 $\mu$m or greater. Finally, the assembly is polished to flatten the entire surface by a CMP process until the thickness of the second interlayer insulating film 15 located on top of the second layer interconnect pattern 23 is reduced to the order of 0.5 to 1.0 $\mu$m.

Subsequently, a photoresist film 16 is formed and patterned by a photolithographic technique to form via-holes 21 and 21' therein in the similar manner as in the first embodiment. Again, this patterning has a small misalignment, and via-holes 21 and 21' will protrude beyond a side of the second layer interconnects 23 and 23' made of Al alloy. It is to be noted that the amount of such protrusion is less than the thickness of the silicon oxide film 14.

By using the photoresist film 16 as a mask, the silicon fluoride oxide film 15 is etched under a similar condition as in the first embodiment. During the etching operation, it will be noted that the depths of the via-holes 21 and 21' are different from each other because of the presence and absence of the underlying first layer interconnect 13. Accordingly, the time interval for the etching operation is selected in accordance with the requirement for the deeper via-hole 21' associated with the second layer interconnect 23'.

Assuming that the thickness of the silicon fluoride oxide film 15 through which the shallower via-hole 21 associated with the second layer interconnect 23 is formed is equal to 0.5 $\mu$m, it follows that when the thickness of the polycrystalline film which defines the first layer interconnect pattern 13 is equal to 0.3 $\mu$m, the thickness of the silicon fluoride oxide film 15 through which the deeper via-hole 21' associated with the interconnect 23' is formed will be equal to 0.8 $\mu$m. In this instance, an over-etch of 100% will be used to etch the silicon fluoride oxide film 15 which is 0.8 $\mu$m thick. In other words, the time interval for etching the silicon fluoride oxide film 15 having a thickness on the order of 1.6 $\mu$m will be used. This represents an over-etch of 200% or greater with respect to the shallower via-hole 21.

In order to allow the silicon oxide film 14 to be left even for such an increased amount of over-etch, it is preferable to select a condition to provide a farther reduced etching rate for the silicon oxide film 14, and at this end, the proportion of CO is farther increased from 95% to the order of 97%. Under this condition, the silicon oxide film 14 can be left at the bottom of the via-hole 21' without being etched away, leaving a thickness equal to or greater than 100 nm.

Figure 7C:
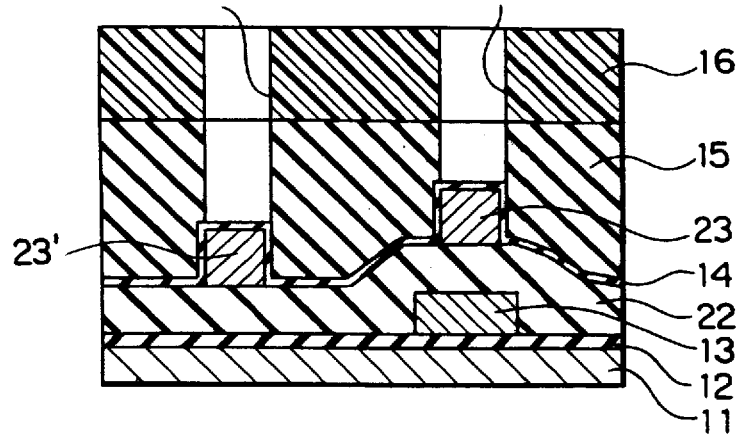
Figure 7D:
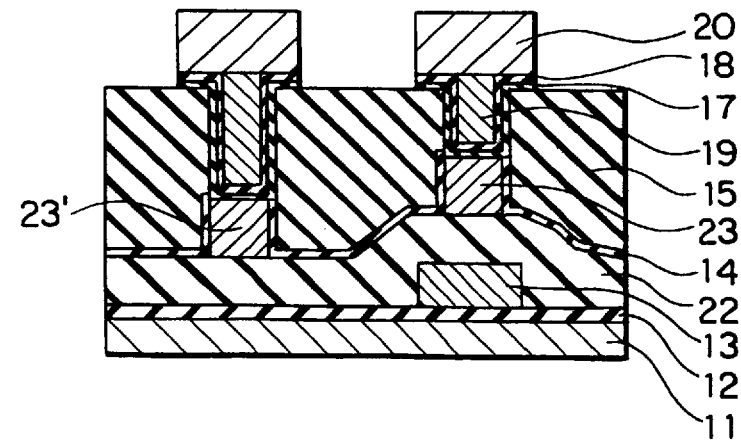

Subsequently, the silicon oxide film 14 is etched under a condition of an increased fluorine content as in the first embodiment, followed by removing the photoresist mask 16, forming a titanium film 17 and a titanium nitride film 18 by a sputtering process as shown in FIG. 7D. Thereafter, a tungsten film 19 is grown over the entire surface by using a CVD process. Then, an etching takes place over the entire surface to leave a tungsten plug 19 in the via-hole 21. Aluminum alloy 10 is then formed by a sputtering process, and by using conventional photolithographic and dry etching techniques, as shown in FIG. 7C, the aluminum alloy 10, the titanium nitride film 18 and the titanium film 17 are patterned to define a third layer interconnect pattern.

In the second embodiment as described above, even if the via-holes 21 and 21' having different depths protrude beyond sides of the second layer interconnects 23 and 23', respectively, the lateral sides on the second layer interconnects 23 and 23' are not etched. In addition, the etching of the silicon oxide film 14 takes place with a substantially equal amount of over-etch for both the via-holes 21 and 21' having different depths, and the amount of over-etch can be reduced. Accordingly, there is obtained an advantage in that films comprising Al and fluorine or carbon are not formed on the sidewall of the via-holes, thereby preventing an increase in the connection resistance of the via-hole or degradation in the yield during the over-etch.

Figure 8A:
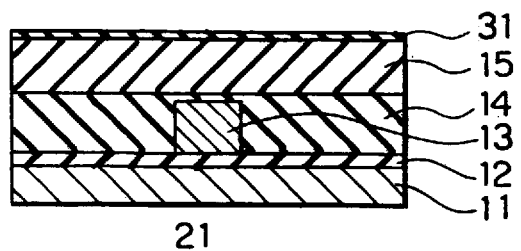
FIGS. 8A to 8F are cross-sections of a semiconductor device, illustrating consecutive steps of another manufacturing process according to a third embodiment of the invention.

Next, a third embodiment of the invention will be described with reference to FIGS. 8A to 8F. Referring first to FIG. 8A, the formation of a first layer interconnect pattern 13 made of aluminum alloy on a silicon oxide film 12 is similar to that in the first embodiment. Subsequently, a first interlayer insulating film 14 made of silicon oxide is formed by a plasma CVD process to a thickness greater than the thickness of the first layer interconnect pattern 13. The surface of the silicon oxide film 14 is polished and flattened so that the thickness of the silicon oxide film 14 on top of the first layer interconnect pattern 13 is in a range from 50 to 200 nm. Subsequently, a second interlayer insulating film 15 made of silicon fluoride oxide is formed to a thickness from 0.5 to 1.0 $\mu$m, followed by forming a third interlayer insulating film 31 made of silicon oxide to a thickness from 50 to 100 nm, both by a plasma CVD process.

Figure 6:
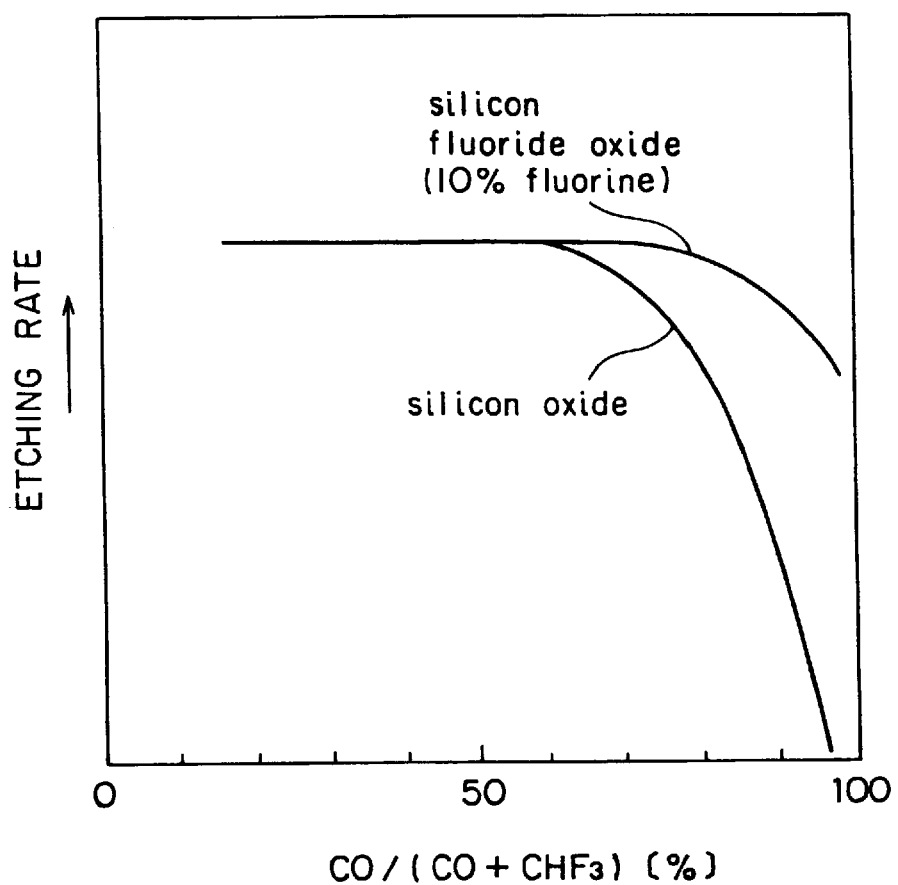
FIG. 6 is a graph illustrating an etching rate plotted against an etching gas.
Figure 8B:
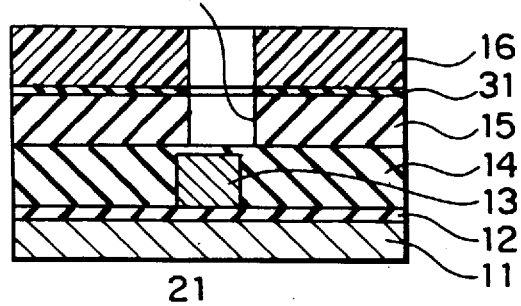

Subsequently, a photoresist film 16 is formed on the third interlayer insulating film 31, then patterned by a photolithographic technique to form via-hole pattern therein. As a result of a slight misalignment, a via-hole pattern protrudes beyond a side of the first layer interconnect pattern 13. By using the photoresist pattern 16 as a mask, the third interlayer insulating film 31 is etched under a usual etching condition for a silicon oxide film containing an increased fluorine content, and then the silicon fluoride oxide film 15 is etched, as shown in FIG. 8B, under a condition of CO gas flow rate equal to 90% or greater of the total gas, as mentioned in connection with FIG. 6, which is a condition of a reduced fluorine content providing a retarded etching rate for the silicon oxide film.

Figure 8C:
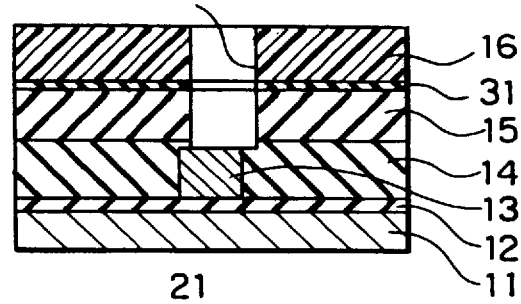

Subsequently, the etching condition is again changed to a condition of increased fluorine content, and the silicon oxide film 14 is etched until the aluminum alloy defining the first layer interconnect pattern 13 is exposed, as shown in FIG. 8C.

Figure 8D:
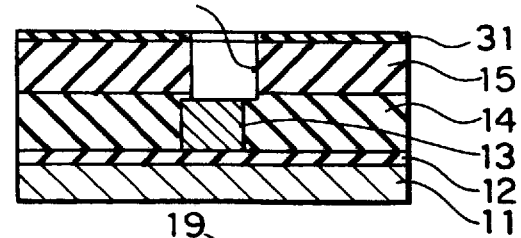
Figure 8E:
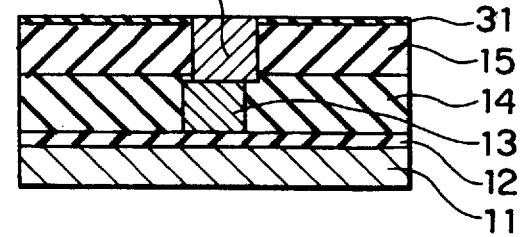
Figure 8F:
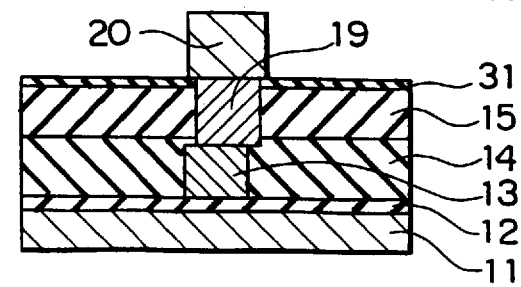

Referring to FIG. 8D, the photoresist film 16 is removed, then WF$_6$ gas is introduced and reduced by SiH$_4$ (monosilane) to thereby grow a tungsten film 19 on the first layer interconnect pattern 3, thereby filling the via-hole 21 with the tungsten film 19, as shown in FIG. 8E. Subsequently, an aluminum alloy film is formed by a sputtering process, then patterned to define a second layer interconnect pattern 20, as shown in FIG. 8F.

In the third embodiment as described above, the surface of the first interlayer insulating film 14 is flattened, and accordingly an etching of the lateral side on the first layer interconnect pattern 13 can be avoided even if the via-hole 21 protrudes beyond a side of the first layer interconnect pattern 13 by an increased amount as compared with the first or the second embodiment.

Since the third interlayer insulating film 31 made of silicon oxide is formed on the second interlayer insulating film 15 which comprises the silicon fluoride oxide film, the aluminum alloy 20 formed on the third interlayer insulator film 31 exhibits an excellent adherence.

Although the present invention is described with reference to preferred embodiments thereof, the present invention is not limited to the embodiments and various modifications or alterations can be easily made by those skilled in the art without departing the scope of the present invention as set forth in the appended claims.

What is claimed is:

1. A method of manufacturing a semiconductor device comprising forming an insulator film overlying a semiconductor substrate, forming a first layer interconnect pattern on the insulator film, forming a first interlayer insulating film containing silicon oxide on the first layer interconnect pattern, forming a second interlayer insulating film containing silicon fluoride oxide on the first interlayer insulating film, selectively etching the second interlayer insulating film to expose a part of the first interlayer insulating film by using a first gas containing fluorine in a first concentration, selectively etching the exposed part of the first interlayer insulating film to form a via-hole reaching the first layer interconnect pattern by using a second gas containing fluorine in a second concentration which is higher than the first concentration, and forming a second layer interconnect pattern connected with the first layer interconnect pattern via the via-hole.

2. A method according to claim 1 wherein said first interlayer insulating film has a thickness in a range from 50 to 200 nm on the first layer interconnect pattern.

3. A method according to claim 1 further comprising flattening the second interlayer insulating film.

4. A method according to claim 1 wherein the first layer interconnect pattern includes a first interconnect and a second interconnect located at different levels from each other.

5. A method of manufacturing a semiconductor device comprising:

forming an insulator film overlying a semiconductor substrate, forming a first layer interconnect pattern on the insulator film, forming a first interlayer insulating film containing silicon oxide on the first layer interconnect pattern, forming a second interlayer insulating film containing silicon fluoride oxide on the first interlayer insulating film, selectively etching the second interlayer insulating film to expose a part of the first interlayer insulating film by using a first gas containing fluorine in a first concentration, selectively etching the exposed part of the first interlayer insulating film to form a via-hole reaching the first layer interconnect pattern by using a second gas containing fluorine in a second concentration which is higher than the first concentration, and forming a second layer interconnect pattern connected with the first layer interconnect pattern via the via-hole, wherein the second interlayer insulating film contains fluorine in a concentration from 5 to 15%.

6. A method of manufacturing a semiconductor device comprising:

forming an insulator film overlying a semiconductor substrate, forming a first layer interconnect pattern on the insulator film, forming a first interlayer insulating film containing silicon oxide on the first layer interconnect pattern, forming a second interlayer insulating film containing silicon fluoride oxide on the first interlayer insulating film, selectively etching the second interlayer insulating film to expose a part of the first interlayer insulating film by using a first gas containing fluorine in a first concentration, selectively etching the exposed part of the first interlayer insulating film to form a via-hole reaching the first layer interconnect pattern by using a second gas containing fluorine in a second concentration which is higher than the first concentration, and forming a second layer interconnect pattern connected with the first layer interconnect pattern via the via-hole, wherein the first gas contains $CHF_3$ gas and CO gas, and has a ratio not higher than 10% for $CHF_3$ gas flow rate relative to a total flow rate of the first gas.

7. A method according to claim 6 wherein the second gas contains $CHF_3$ gas and CO gas, and has a ratio not lower than 40% for $CHF_3$ gas flow rate relative to a total flow rate of the second gas.

8. A method according to claim 1, further comprising forming a third interlayer insulating film containing silicon oxide on the second interlayer insulating film before said etching of the second interlayer insulating film wherein the via-hole penetrates the third interlayer insulating film.

9. A method according to claim 5 wherein said first interlayer insulating film has a thickness in a range from 50 to 200 nm on the first layer interconnect pattern.

10. A method according to claim 5 further comprising flattening the second interlayer insulating film.

11. A method according to claim 5 wherein the first layer interconnect pattern includes a first interconnect and a second interconnect located at different levels from each other.

12. A method according to claim 5 further comprising forming a third interlayer insulating film containing silicon oxide on the second interlayer insulating film before said etching of the second interlayer insulating film wherein the via-hole penetrates the third interlayer insulating film.

13. A method according to claim 6 wherein said first interlayer insulating film has a thickness in a range from 50 to 200 nm on the first layer interconnect pattern.

14. A method according to claim 6 further comprising flattening the second interlayer insulating film.

15. A method according to claim 6 wherein the first layer interconnect pattern includes a first interconnect and a second interconnect located at different levels from each other.

16. A method according to claim 6 further comprising forming a third interlayer insulating film containing silicon oxide on the second interlayer insulator film before said etching of the second interlayer insulating film wherein the via-hole penetrates the third interlayer insulating film.

17. A method according to claim 6, wherein the second interlayer insulating film contains fluorine in a concentration from 5 to 15%.

* * * * *

UNITED STATES PATENT AND TRADEMARK OFFICE
CERTIFICATE OF CORRECTION

PATENT NO. : 5,827,778
DATED : October 27, 1998
INVENTOR(S) : Yoshiaki YAMADA

It is certified that error appears in the above-identified patent and that said Letters Patent is hereby corrected as shown below:

Column 6, line 11, delete "fluorine" and insert --fluoride--; and

Column 6, line 17, delete "fluorine" and insert --fluoride--.

Signed and Sealed this

Fifteenth Day of June, 1999

Attest:

Q. TODD DICKINSON

*Attesting Officer*       *Acting Commissioner of Patents and Trademarks*